United States Patent
Cho et al.

(10) Patent No.: US 9,397,212 B2
(45) Date of Patent: Jul. 19, 2016

(54) POWER CONVERTER PACKAGE INCLUDING TOP-DRAIN CONFIGURED POWER FET

(71) Applicant: International Rectifier Corporation, El Segundo, CA (US)

(72) Inventors: Eung San Cho, Torrance, CA (US); Andrew N. Sawle, East Grinstead (GB); Mark Pavier, Felbridge (GB); Daniel Cutler, Betchworth (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/021,802

(22) Filed: Sep. 9, 2013

(65) Prior Publication Data

US 2014/0110788 A1   Apr. 24, 2014

Related U.S. Application Data

(60) Provisional application No. 61/715,718, filed on Oct. 18, 2012.

(51) Int. Cl.

| | |
|---|---|
| *H01L 29/78* | (2006.01) |
| *H01L 29/66* | (2006.01) |
| *H01L 23/492* | (2006.01) |
| *H01L 23/495* | (2006.01) |
| *H01L 25/07* | (2006.01) |
| *H01L 25/11* | (2006.01) |
| *H01L 23/36* | (2006.01) |
| *H01L 23/00* | (2006.01) |
| *H01L 23/31* | (2006.01) |

(52) U.S. Cl.
CPC ............ *H01L 29/7827* (2013.01); *H01L 23/36* (2013.01); *H01L 23/492* (2013.01); *H01L 23/49517* (2013.01); *H01L 23/49562* (2013.01); *H01L 23/49575* (2013.01); *H01L 24/18* (2013.01); *H01L 25/072* (2013.01); *H01L 25/115* (2013.01); *H01L 29/66666* (2013.01); *H01L 23/3107* (2013.01); *H01L 2224/04105* (2013.01); *H01L 2224/06181* (2013.01); *H01L 2224/32245* (2013.01); *H01L 2224/73267* (2013.01); *H01L 2224/92244* (2013.01); *H01L 2924/1306* (2013.01); *H01L 2924/13091* (2013.01)

(58) Field of Classification Search
CPC ................. H01L 2924/00; H01L 2924/13091; H01L 23/49575
USPC ........... 257/676, E21.499, E23.031, E29.262, 257/686, 777; 438/107, 108
See application file for complete search history.

(56) References Cited

U.S. PATENT DOCUMENTS

| 8,120,158 | B2 * | 2/2012 | Ewe ......................... H01L 21/56 257/686 |
|---|---|---|---|
| 2010/0013011 | A1 * | 1/2010 | Ashrafzadeh ......... H01L 23/041 257/341 |
| 2010/0090668 | A1 * | 4/2010 | Girdhar ................. H01L 23/645 323/282 |
| 2011/0210708 | A1 | 9/2011 | Herbsommer |

(Continued)

*Primary Examiner* — Jaehwan Oh
(74) *Attorney, Agent, or Firm* — Farjami & Farjami LLP

(57) ABSTRACT

In one implementation, a semiconductor package includes a top-drain vertical FET in a first active die, a source of the top-drain vertical FET situated on a source side of the first active die and a drain and a gate of the top-drain vertical FET situated on a drain side of the first active die. The semiconductor package also includes a bottom-drain vertical FET in a second active die, a source and a gate of the bottom-drain vertical FET situated on a source side of the second active die and a drain of the bottom-drain vertical FET situated on a drain side of the second active die. The semiconductor package includes a conductive carrier attached to the source side of the first active die and to the drain side of the second active die, the conductive carrier coupling the source of the top-drain vertical FET to the drain of the bottom-drain vertical FET.

20 Claims, 8 Drawing Sheets

(56) References Cited

U.S. PATENT DOCUMENTS

2011/0298115 A1* 12/2011 Celaya ............... H01L 23/4952 257/676

2012/0119343 A1* 5/2012 Bayan ................. H01L 21/4842 257/676

2012/0326287 A1* 12/2012 Joshi ................. H01L 23/29548 257/676

* cited by examiner

POWER CONVERTER PACKAGE INCLUDING TOP-DRAIN CONFIGURED POWER FET

The present application claims the benefit of and priority to a provisional application entitled "Power Converter Package Including Top-Drain Configured Power PET," Ser. No. 61/715,718 filed on Oct. 18, 2012. The disclosure in this provisional application is hereby incorporated fully by reference into the present application.

BACKGROUND

Background Art

Power converters are used in a variety of electronic circuits and systems. Many integrated circuit (IC) applications, for instance, require conversion of a direct current (DC) input to a lower, or higher, DC output. For example, a synchronous buck converter may be implemented as a voltage regulator to convert a higher voltage DC input to a lower voltage DC output for use in low voltage applications in which relatively large output currents are required.

The voltage converted output of a synchronous buck converter is typically provided through a switch node situated between a high side control switch and a low side synchronous (sync) switch of the power converter switching stage. The electrical connection between the control and sync power switches may be implemented using a conductive clip, such as a copper clip, which must be sufficiently robust to accommodate high current. Moreover, because the control and sync power switches can be very sensitive to electrical resistance, the cross-sectional area of the conductive clip used to provide the switch node is often relatively large. Consequently, packaging solutions for such power converters must typically be sized to accommodate not only the control and sync switches of the power converter switching stage, but a relatively large conductive clip for connection of those power switches as well.

SUMMARY

The present disclosure is directed to a power converter package including a top-drain configured power field-effect transistor (FET), substantially as shown in and/or described in connection with at least one of the figures, and as set forth more completely in the claims.

DETAILED DESCRIPTION

Figure 1:
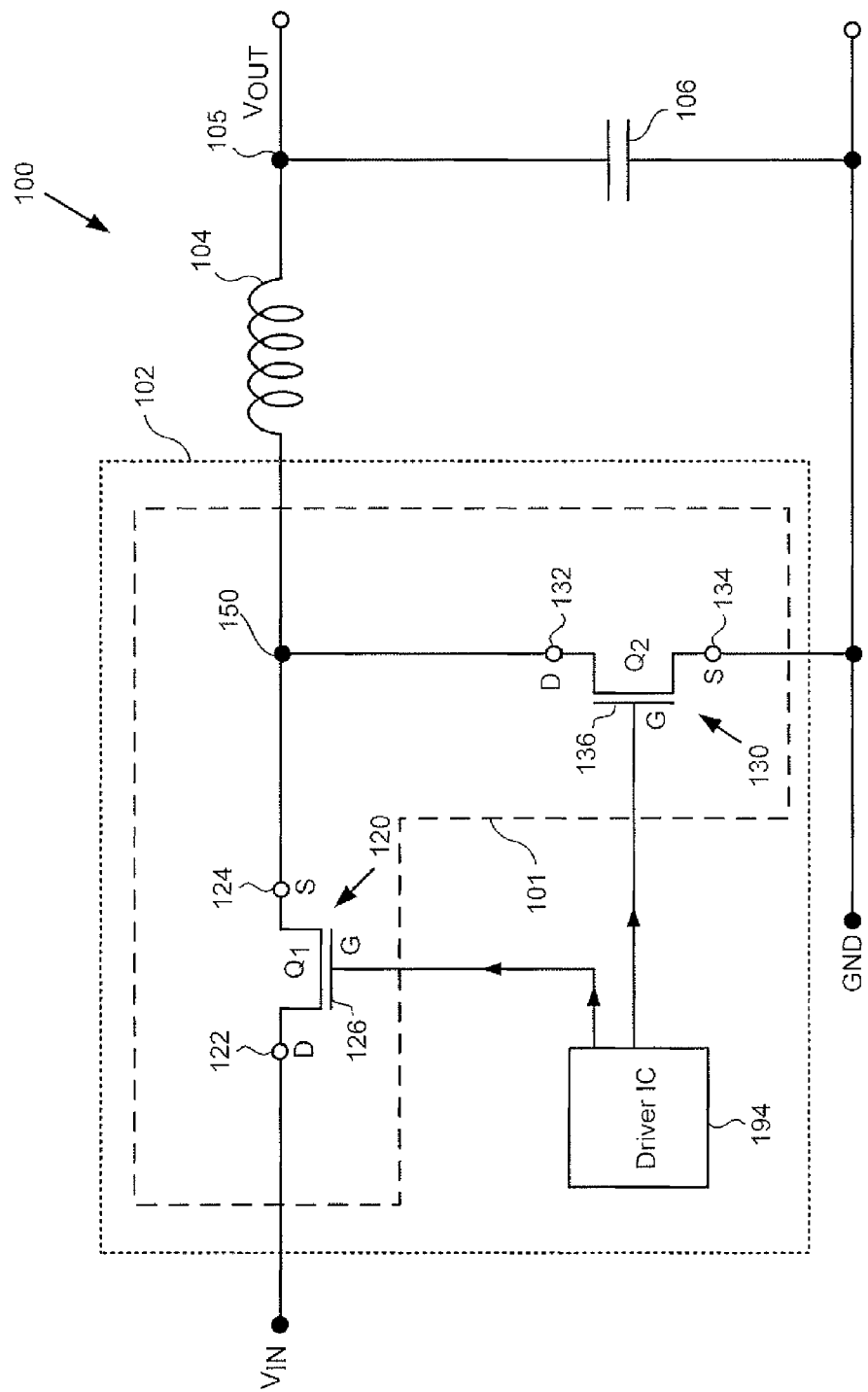
FIG. 1 shows a diagram of an exemplary power converter circuit.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, power converters such as voltage regulators are used in a variety of electronic circuits and systems. For instance, and as noted above, integrated circuit (IC) applications may require conversion of a direct current (DC) input to a lower, or higher, DC output. As a specific example, a buck converter may be implemented as a voltage regulator to convert a higher voltage DC input to a lower voltage DC output for use in low voltage applications in which relatively large output currents are required.

FIG. 1 shows a diagram of an exemplary power converter circuit. Power converter 100 includes power converter multichip module (MCM) 102, output inductor 104, and output capacitor 106. As shown in FIG. 1, MCM 102 includes switching stage 101 of power converter 100, and driver IC 194 implemented to provide drive signals to switching stage 101. As shown in FIG. 1, power converter 100 is configured to receive an input voltage $V_{IN}$, and to provide a converted voltage, e.g., a rectified and/or stepped down voltage, as $V_{OUT}$ at output 105.

Switching stage 101 may be implemented using two power switches in the form of metal-oxide-semiconductor field-effect transistors (MOSFETs) configured as a half bridge, for example. That is to say, switching stage 101 may include high side or control switch 120 ($Q_1$) having drain 122, source 124, and gate 126, as well as low side or synchronous (sync) switch 130 ($Q_2$) having drain 132, source 134, and gate 136. Control switch 120 is coupled with sync switch 130 at switch node 150, which, in turn, is coupled to output 105 through output inductor 104. Respective control and sync switches 120 and 130 may be implemented as group IV based power devices, such as silicon power MOSFETs fabricated as vertical FETs, for example. Power converter 100 may be advantageously utilized as a voltage converter, for example a buck converter, in a variety of automotive, industrial, appliance, and lighting applications.

It is noted that in the interests of ease and conciseness of description, the present inventive principles will in some instances be described by reference to specific implementations of a buck converter including one or more silicon based power transistors. However, it is emphasized that such implementations are merely exemplary, and the inventive principles disclosed herein are broadly applicable to a wide range of applications, including buck and boost converters, implemented using other group IV material based, or group III-V semiconductor based, power transistors. It is noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

As noted above, the connection between control switch 120 and sync switch 130 providing switch node 150 can be implemented using a conductive clip, such as a copper clip, which must be sufficiently robust to accommodate high current. Moreover, because control switch 120 and sync switch 130 can be very sensitive to electrical resistance, the cross-sectional area of the conductive clip used to provide switch node 150 is often relatively large. Consequently, packaging solutions for power converters, such as a power switching module containing switching stage 101, or MCM 102 including switching stage 101 and driver IC 194, must be sized to accommodate a large conductive clip for connection of the power switches.

The present application discloses a packaging solution enabling omission of such a conductive clip, or any other feature implemented solely or primarily as a switch node electrical connector, while concurrently providing a reliable, low resistance, and substantially parasitic free electrical connection for establishing switch node 150. In one implementation, control switch 120 is configured as a "top-drain" vertical FET, while sync switch 130 is implemented using a conventional "bottom-drain" vertical FET topology. As a result, a conductive carrier utilized as a structural support in the packaging solution, such as a conductive lead frame for example, may be used to couple control switch 120 to sync switch 130 so as to provide switch node 150. In one such implementation, the conductive carrier may provide a substantially direct electrical connection between source 124 of control switch 120 and drain 132 of sync switch 130.

It is noted that as used herein, the expression "top-drain vertical FET" refers to a vertical FET having a drain and gate situated on the same "drain side" of the vertical FET, while the source is situated on an opposite "source side" of the vertical FET. By contrast, a conventionally designed "bottom-drain vertical FET" has a source and gate situated on the same "source side" of the vertical FET, while the drain is situated on an opposite "drain side" of the vertical FET.

Figure 2:
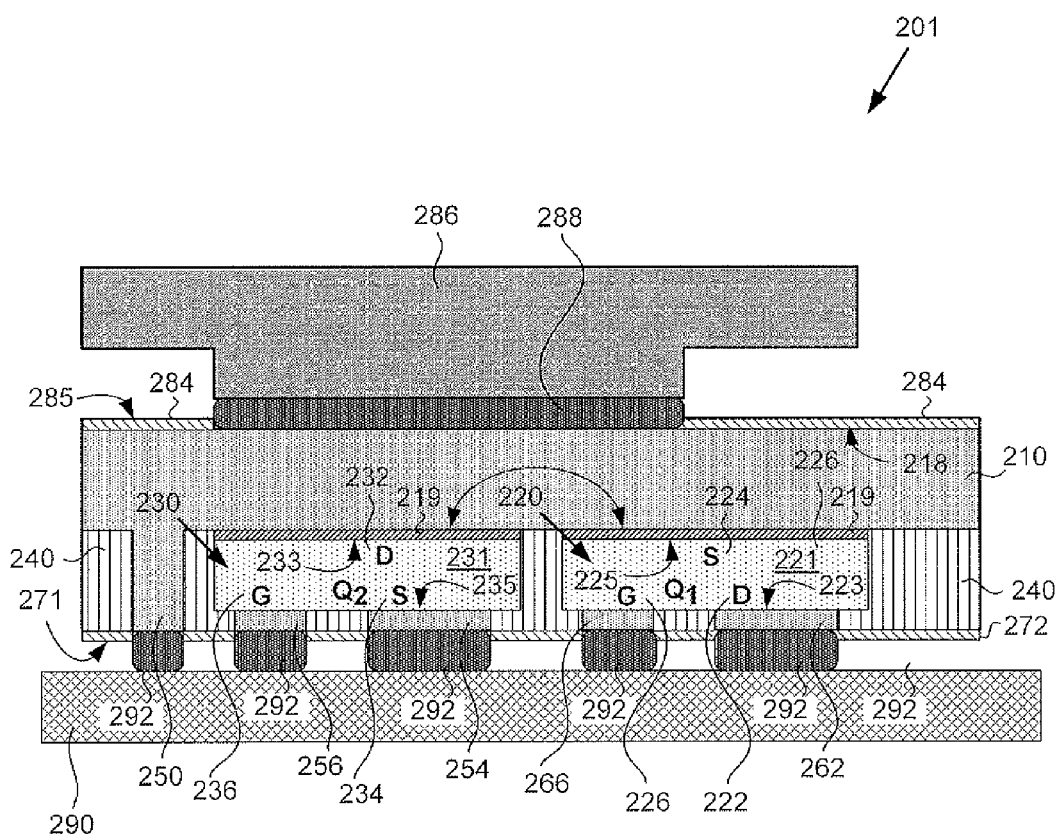
FIG. 2 shows a cross-sectional view of an exemplary semiconductor package including a top-drain configured power field-effect transistor (FET), according to one implementation.

FIG. 2 shows a cross-sectional view of an exemplary semiconductor package including a top-drain configured power FET, according to one implementation. FIG. 2 shows semiconductor package 201 mounted on printed circuit board (PCB) 290 by solder bodies 292 at surface 271 of semiconductor package 201. Semiconductor package 201 includes control switch $Q_1$ implemented as top-drain vertical FET 220 in first or control active die 221, and sync switch $Q_2$ implemented as bottom-drain vertical FET 230 in second or sync active die 231. Top-drain vertical FET 220 includes source 224 on source side 225 of first or control active die 221, and drain 222 and gate 226 on drain side 223 of first or control active die 221. Bottom-drain vertical FET 230 includes source 234 and gate 236 on source side 235 of second or sync active die 231, and drain 232 on drain side 233 of second or sync active die 231.

Semiconductor package 201 further includes conductive carrier 210 having respective surface 218, electrically conductive die attach material 219, patterned dielectric 240, and patterned insulator layers 272 and 284. As shown in FIG. 2, conductive carrier 210 may be attached to source side 225 of first active die 221 and to drain side 233 of second active die 231 so as to couple source 224 to drain 232. Also included in semiconductor package 201 are drain contact 262, source contact 254, gate contacts 256 and 266, switch node contact 250 provided by conductive carrier 210, and heat spreader 286 mounted to conductive carrier 210 by solder body 288 through surface 285.

Semiconductor package 201 corresponds in general to switching stage 101 in FIG. 1. In addition, top-drain vertical FET 220 having drain 222, source 224, and gate 226, and bottom-drain vertical FET 230 having drain 232, source 234, and gate 236, correspond in general to control switch 120 having drain 122, source 124, and gate 126, and sync switch 130 having drain 132, source 134, and gate 136, respectively, in FIG. 1. In other words, respective top-drain and bottom-drain vertical FETs 220 and 230, in FIG. 2, may be utilized to implement switching stage 101 of power converter 100, in FIG. 1. Moreover, switch node contact 250, in FIG. 2, corresponds to switch node 150 of switching stage 101, in FIG. 1.

The features of semiconductor package 201 will be now be described in greater detail by reference to FIG. 3, and FIGS. 4A, 4B, 4C, 4D, 4E, and 4F (hereinafter "FIGS. 4A-4F"). However, it is noted in reference to FIG. 2 that the electrical connection between source 224 of top-drain vertical FET 220 and drain 232 of bottom-drain vertical FET 230 is established in the absence of a conductive clip or other feature implemented solely or primarily as an electrical connector. Instead, according to the implementation shown in FIG. 2, the coupling of source 224 to drain 232 that establishes switch node contact 250 is advantageously provided by conductive carrier 210 and conductive die attach material 219. As a result, the packaging solution of FIG. 2 provides a robust, low resistance, and low parasitic electrical conduction path for providing switch node contact 250. Moreover, the inventive concepts disclosed by the packaging solution represented in FIG. 2 can be extended to enable the fabrication of high density MCM packages, with reduced parasitics.

Figure 3:
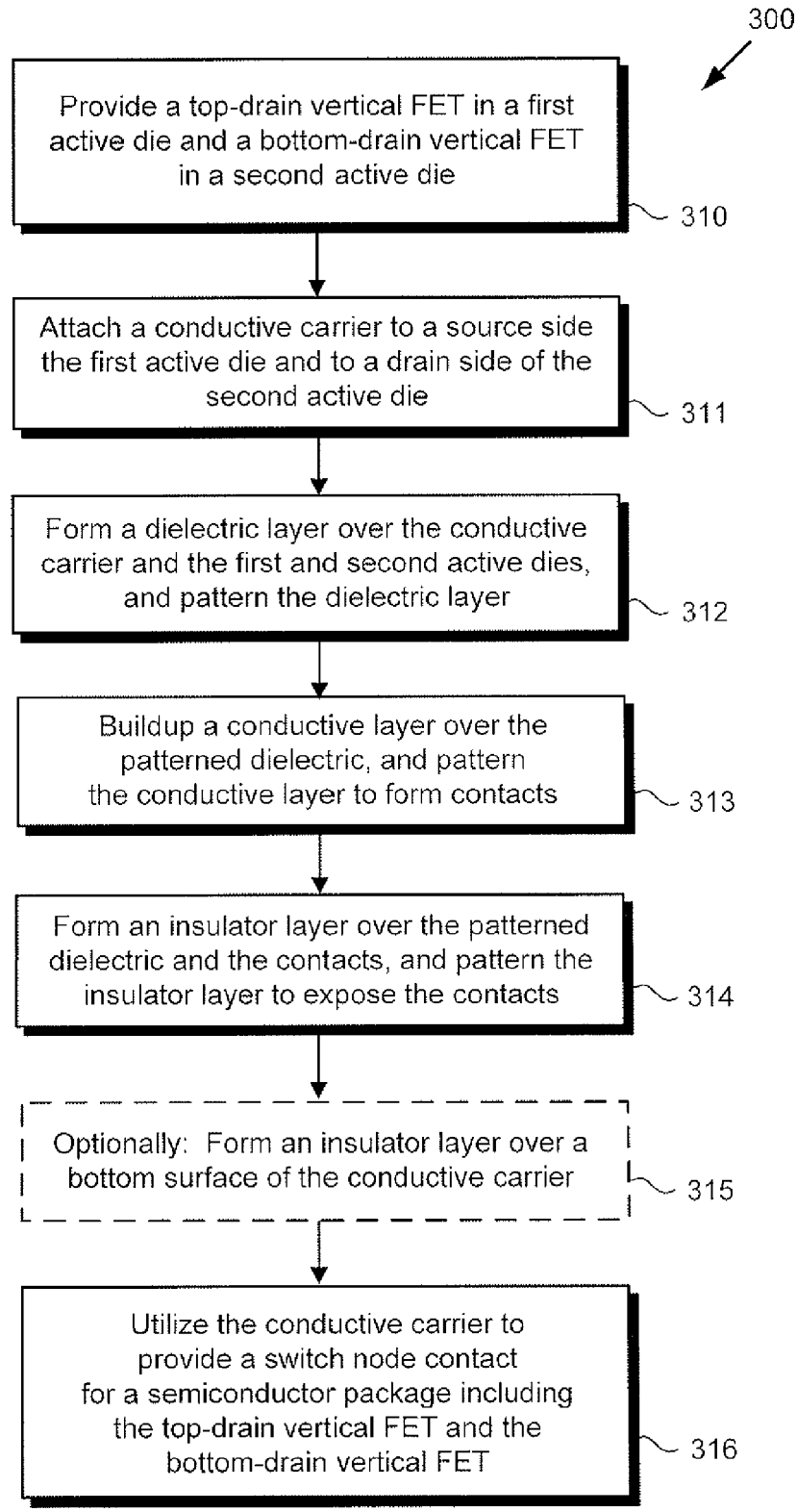
FIG. 3 shows a flowchart presenting one exemplary method for fabricating a semiconductor package including a top-drain configured power FET.

Referring to FIG. 3, FIG. 3 shows flowchart 300 presenting an exemplary method for fabricating a semiconductor package including a top-drain configured power FET. It is noted that the method described by flowchart 300 is performed using a conductive carrier, which may be a semiconductor package lead frame, or may take the form of a conductive sheet or plate, for example.

Figure 4A:
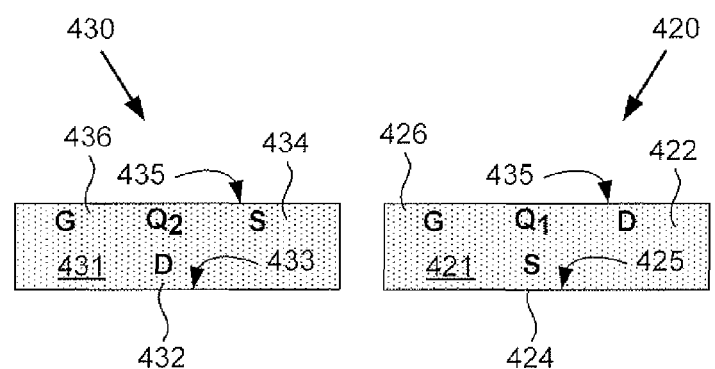
FIG. 4A depicts an initial stage of the method described in FIG. 3.
Figure 4B:
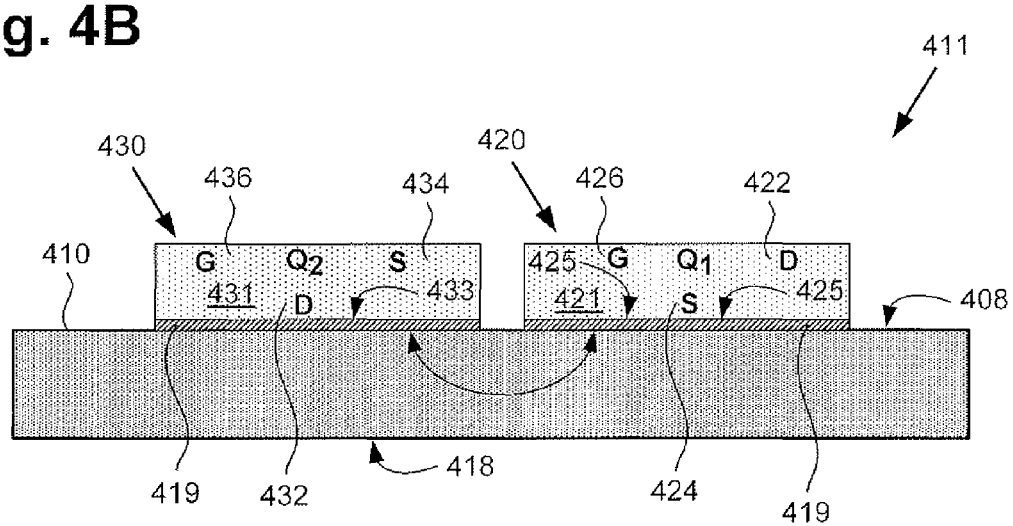
FIG. 4B shows an exemplary structure corresponding to an intermediate stage of the method described in FIG. 3.
Figure 4C:
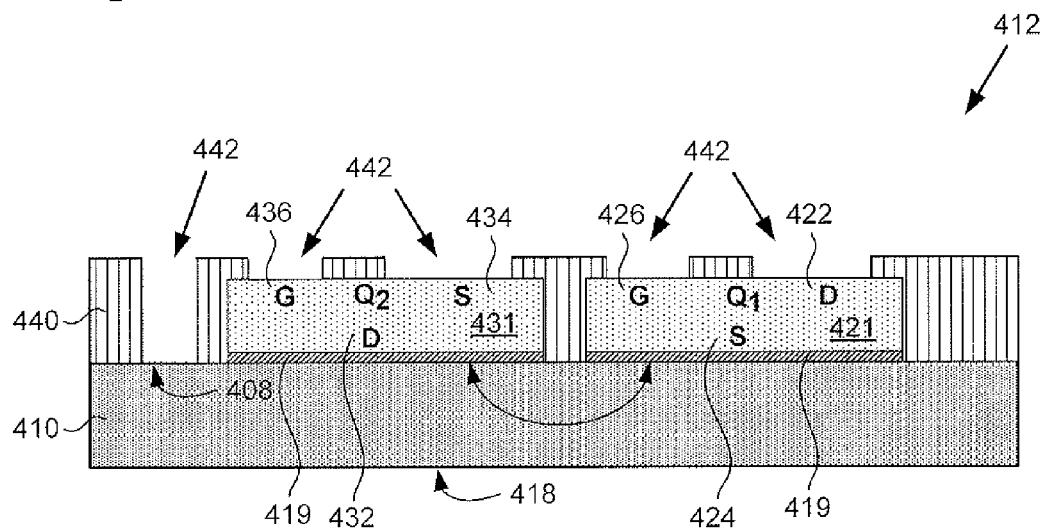
FIG. 4C shows the exemplary structure in FIG. 4B at another intermediate stage of the fabrication method described in FIG. 3.

With respect to FIGS. 4A-4F, those figures illustrate the result of performing the method of flowchart 300. For example, FIG. 4A depicts respective top-drain and bottom-drain vertical FETS 420 and 430 (310), structure 411 in FIG. 4B shows a portion of conductive carrier 410 attached to respective top-drain and bottom-drain vertical FETs 420 and 430 (311), structure 412 in FIG. 4C shows structure 411 after the formation and patterning of a dielectric layer (312), and so forth. It is noted that conductive carrier 410, in FIGS. 4B through 4F corresponds in general to conductive carrier 210, in FIG. 2. It is further noted that although FIGS. 4A-4F depict formation of a structure including one dielectric layer and one conductive buildup layer, other implementations using the present concepts may include more than one dielectric layer and more than one conductive buildup layer.

Referring to flowchart 300, in FIG. 3, in combination with FIG. 4A, flowchart 300 begins with providing respective top-drain and bottom-drain vertical FETs 420 and 430 in respective first and second active dies 421 and 431 (310). As shown in FIG. 4A, in one implementation, top-drain vertical FET 420 may be used to provide control switch $Q_1$ having source on source side 425 of first or control active die 421, and drain 422 and gate 426 on drain side 423 of first or control active die 421. Bottom-drain vertical FET 430 may be used to provide sync switch $Q_2$ having source 434 and gate 436 on source side 435 of second or sync active die 431, and drain 432 on drain side 433 of second or sync active die 431.

In one implementation, respective top-drain and bottom-drain vertical FETs 420 and 430 providing respective control and sync switches $Q_1$ and $Q_2$ may take the form of group IV material based vertical FETs, such as silicon vertical MOSFETs for example. However, in other implementations, control and sync switches $Q_1$ and $Q_2$ may take the form of group III-V based power transistors, such as GaN or other III-Nitride based FETs. Top-drain vertical FET 420 in first or control active die 421 and bottom-drain vertical FET 430 in second or sync active die 431 correspond respectively to top-drain vertical FET 220 in first or control active die 221 and bottom-drain vertical FET 230 in second or sync active die 231, in FIG. 2.

Moving to structure 411 in FIG. 4B with ongoing reference to FIG. 3, flowchart 300 continues with attaching conductive carrier 410 to source side 425 of first or control active die 421 and to drain side 433 of second or sync active die 431 (311). As shown in FIG. 4B, conductive carrier 410 is represented as a conductive sheet or plate having top surface 408 and bottom surface 418. Conductive carrier 410 may be formed of any conductive material having a suitably low electrical resistance. Examples of materials from which conductive carrier 410 may be formed include copper (Cu), aluminum (Al), or a conductive alloy. As noted above, in one implementation, conductive carrier 410 may be implemented using a semiconductor package lead frame.

Although not shown in the present figures, in some implementations, conductive carrier 410 may include a barrier metal layer formed on one or both of top surface 408 and bottom surface 418. Such a barrier metal layer may be formed of nickel-gold (NiAu) or nickel-palladium-gold (NiPdAu), for example. In some implementations, such a barrier metal layer may serve as an etching mask during patterning of conductive carrier 410. Thereafter, such a barrier metal layer can provide a solderable surface at one or both of top surface 408 and bottom surface 418 of conductive carrier 410.

As shown in FIG. 4B, top surface 408 of conductive carrier 410 is attached to source side 425 of first or control active die 421 and to drain side 433 of second or sync active die 431 by die attach material 419, which, according to the present exemplary implementation is an electrically conductive die attach material. Electrically conductive die attach material 419 may be any suitable substance, such as a conductive epoxy, solder, a conductive sintered material, or diffusion bonded material, and may be formed to a thickness of from approximately 0.5 mm to approximately 2.0 mm, for example. Electrically conductive die attach material 419 corresponds to electrically conductive die attach material 219, in FIG. 2, while conductive carrier 410, in FIG. 4B, corresponds in general to conductive carrier 210, in FIG. 2.

As shown by structure 412 in FIG. 4C, flowchart 300 continues with forming a dielectric layer over conductive carrier 410, first or control active die 421, and second or sync active die 431, followed by patterning of the dielectric layer to form patterned dielectric 440 (312). Patterned dielectric 440 may be formed by initially laminating a pre-formed dielectric layer onto conductive carrier 410, first or control active die 421, and second or sync active die 431, and then patterning the pre-formed dielectric layer to produce windows 442. Such a pre-formed dielectric layer may be cut or otherwise patterned from a pre-formable dielectric material, such as an epoxy-phenolic or cyanate ester-epoxy build-up material, for example, or any other pre-formable dielectric utilized in laminate substrate technology. In one implementation, for example, patterned dielectric 440 may be formed of a B-stage polymeric material cured during lamination.

Patterning of the dielectric layer to form patterned dielectric 440 including windows 442 can be performed using any known technique, such as etching. Patterned dielectric 440 includes windows 442 exposing top surface 408 of conductive carrier 410 adjacent one of first or control active die 421 and second or sync active die 431 (e.g., second or sync active die 431 in FIG. 4C), as well as windows 442 exposing drain 422, source 434, and gates 426 and 436. Patterned dielectric 440 corresponds to patterned dielectric 240, in FIG. 2.

Figure 4D:
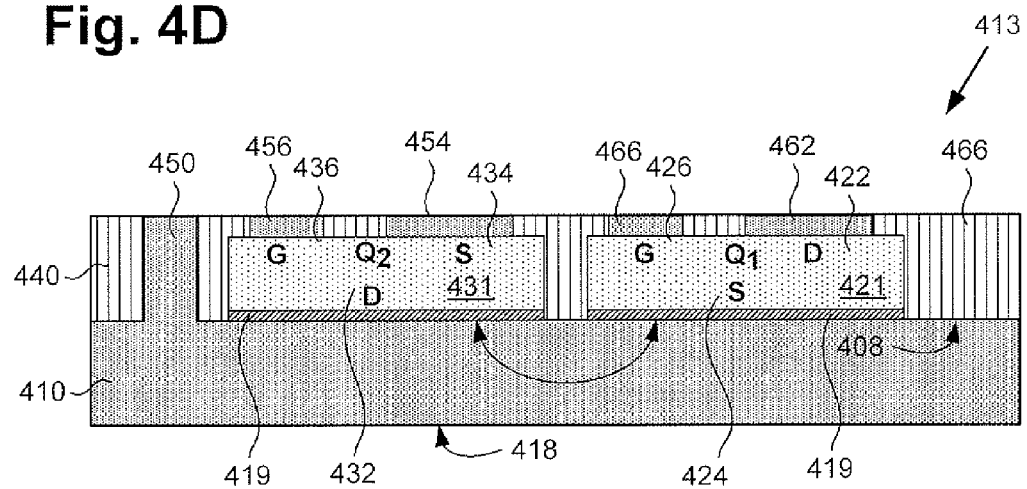
FIG. 4D shows the exemplary structure in FIG. 4C at another intermediate stage of the fabrication method described in FIG. 3.

Moving to structure 413 in FIG. 4D, flowchart 300 continues with buildup of a conductive layer over patterned dielectric 440, and patterning of the conductive layer to form contacts 462, 466, 450, 454, and 456 (313). The conductive layer may be formed of Cu or Al, for example, or may be a metal alloy, such as a metal alloy including Cu and Ni, for example. Such a conductive layer may be built up using any suitable technique, such as electrochemical deposition or an electrolytic plating process, for example. After buildup, the conductive layer is patterned to form drain contact 462, gate contacts 466 and 456, switch node contact 450, and source contact 454. Drain contact 462, gate contacts 466 and 456, switch node contact 450, and source contact 454 correspond respectively to drain contact 262, gate contacts 266 and 256, switch node contact 250, and source contact 254, in FIG. 2.

Figure 4E:
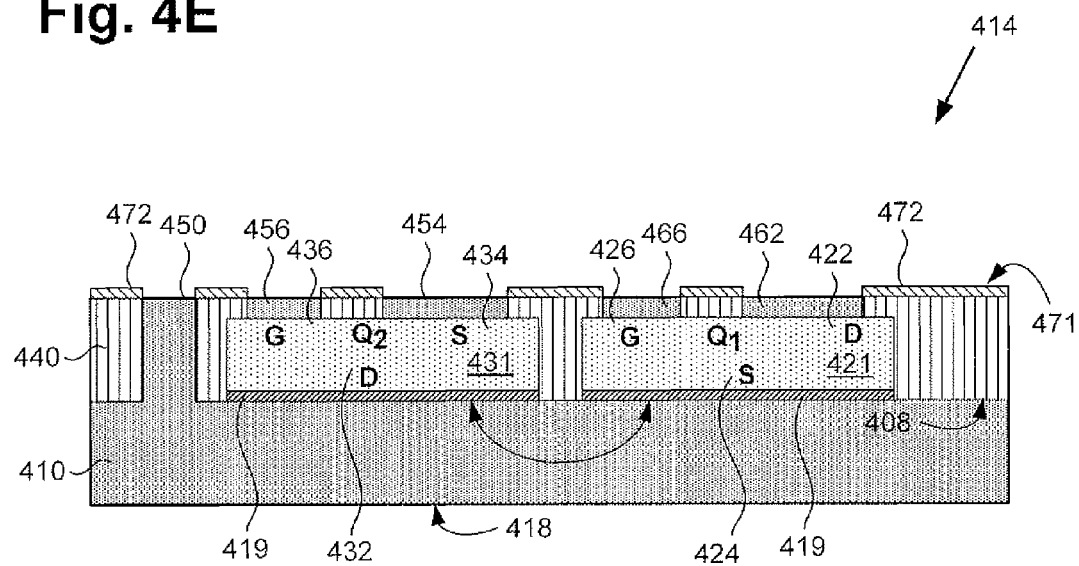
FIG. 4E shows the exemplary structure in FIG. 4D at another intermediate stage of the fabrication method described in FIG. 3.

Continuing to structure 414 in FIG. 4E, flowchart 300 continues with forming an insulator layer over patterned dielectric 440 and contacts 462, 466, 450, 454, and 456, and patterning the insulator layer to expose contacts 462, 466, 450, 454, and 456 (314). The insulator layer may be formed as a blanket layer of solder resist, for example, which is thereafter patterned to form patterned insulator layer 472 providing surface 471. Patterned insulator layer 472 providing surface 471 corresponds to patterned insulator layer 272 providing surface 271, in FIG. 2.

Figure 4F:
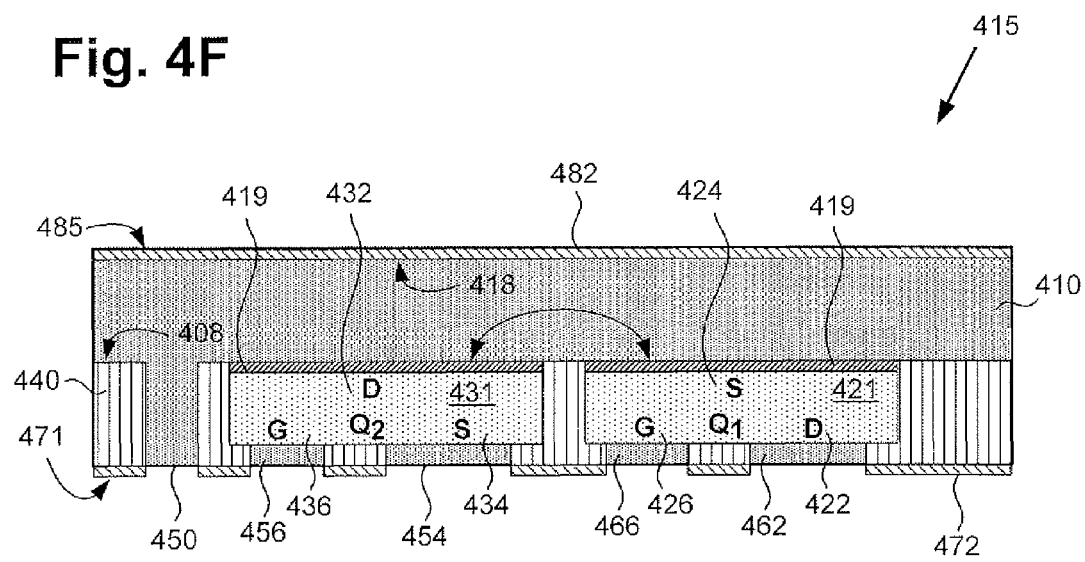
FIG. 4F shows the exemplary structure in FIG. 4E at another intermediate stage of the fabrication method described in FIG. 3.

Moving to structure 415 in FIG. 4F, flowchart 300 may optionally include formation of insulator layer 482 at bottom surface 418 of conductive carrier 410 (315). Insulator layer 482 may be formed of solder resist, for example, and may be deposited or otherwise formed as a blanket layer over bottom surface 418 so as to provide surface 485 corresponding to surface 285, in FIG. 2.

It is reiterated that conductive carrier 410 electrically connects source 424 of top-drain vertical FET 420 to drain 432 of bottom-drain vertical FET 430. In addition, conductive carrier 410 provides switch node contact 450 accessible through surface 471. In some implementations, the method of flowchart 300 may optionally continue with attachment of a heat spreader to bottom surface 418 of conductive carrier 410. Such an implementation is shown in FIG. 2, wherein insulator layer 482 has been patterned to form patterned insulator layer 284 capable of accommodating solder body 288, and heat spreader 286 has been mounted through surface 285 using solder body 288.

The method of flowchart 300 may conclude with utilizing conductive carrier 410 to provide switch node contact 450 for a semiconductor package including respective top-drain and bottom-drain vertical FETs 420 and 430 (317). As shown in FIGS. 4B through 4F, for example, conductive carrier 410 couples source 424 of top-drain vertical FET 420 to drain 432 of bottom-drain vertical FET 430.

Referring to FIG. 2 in combination with FIG. 4F, conductive carrier 210/410 can be used to provide switch node contact 250/450, which in turn is configured to provide an output node of semiconductor package 201 accessible through surface 271/471. Consequently, the electrical connection between source 224/424 of top-drain vertical FET 220/420 and drain 232/432 of bottom-drain vertical FET 230/430 may be established in the absence of a conductive clip or other feature implemented solely or primarily as an electrical connector. Thus, the exemplary method of flowchart 300 enables fabrication of a semiconductor package including a top-drain configured power FET, having a robust, low resistance, and low parasitic electrical conduction path for providing switch node contact 250/450.

Figure 5:
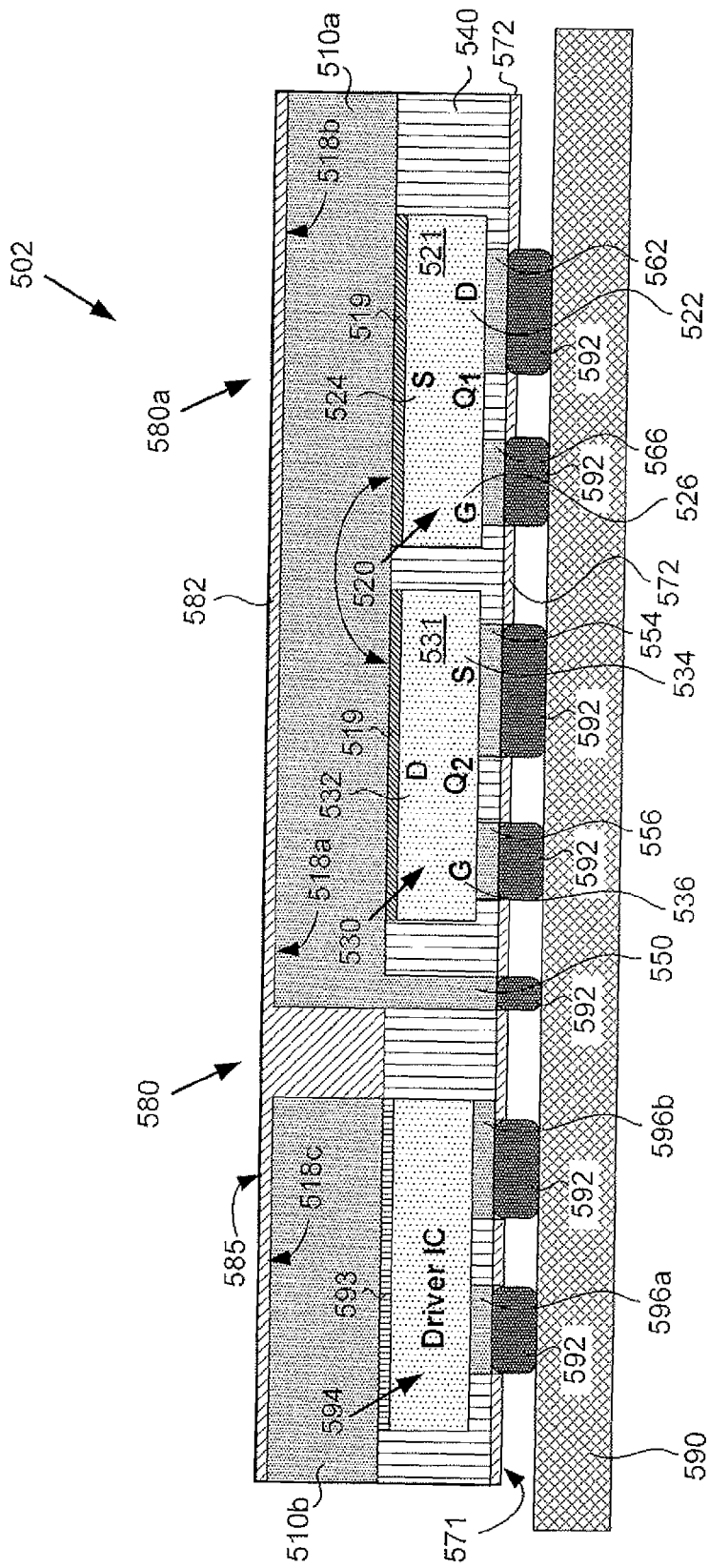
FIG. 5 shows a cross-sectional view of an exemplary semiconductor package including a top-drain configured power FET and a driver integrated circuit (IC), according to one implementation.
Figure 6:
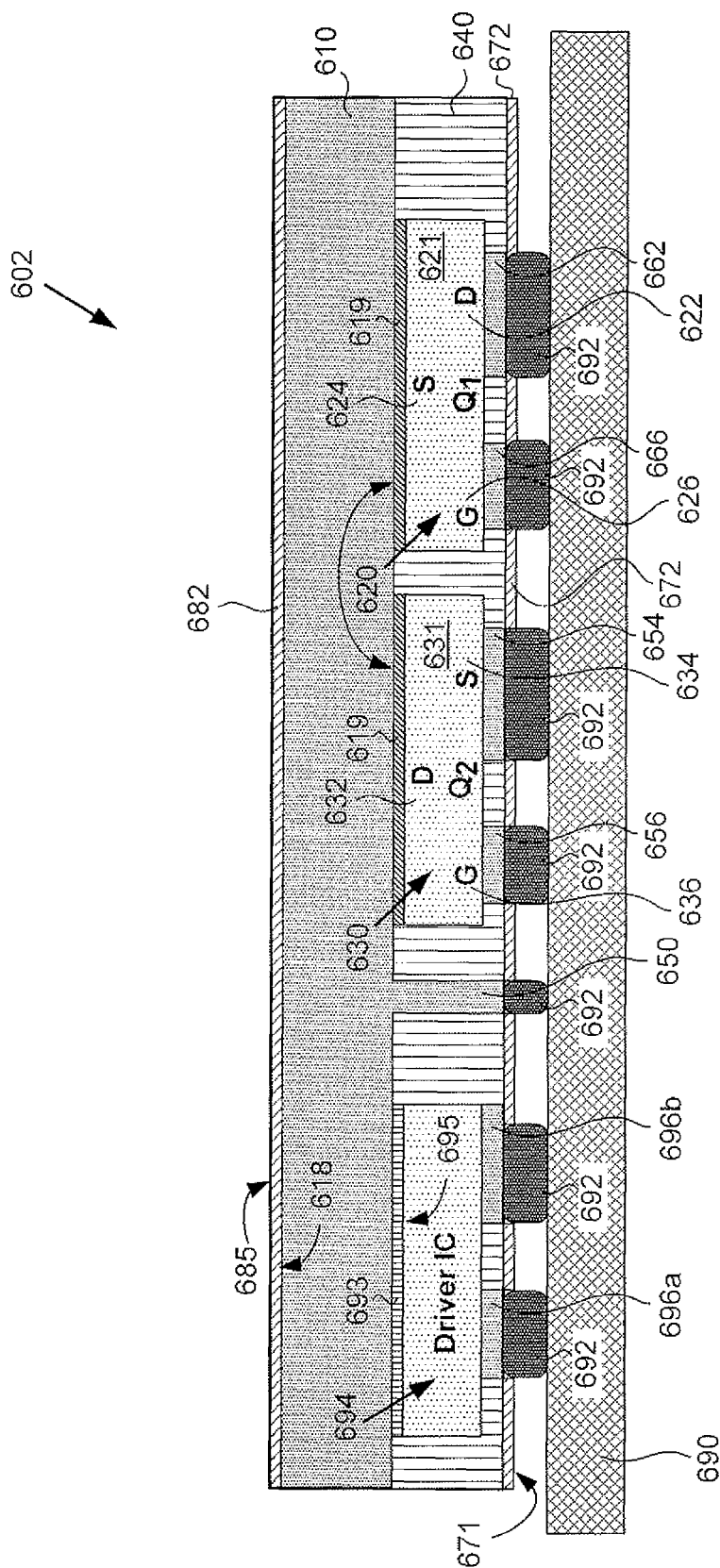
FIG. 6 shows a cross-sectional view of an exemplary semiconductor package including a top-drain configured power FET and a driver IC, according to another implementation.

Although the implementations shown and described by reference to FIGS. 2, 3, and 4A-4F result in an MCM, such as semiconductor package 201, in FIG. 2, configured to enclose switching stage 101, in FIG. 1, in some applications, it may be desirable to produce a semiconductor package corresponding to MCM 102. Example implementations of such an MCM package are shown by FIGS. 5 and 6. One of ordinary skill in the art will readily understand that the exemplary method outlined by flowchart 300, in FIG. 3, can be suitably adapted to produce the exemplary MCM package structures shown in FIGS. 5 and 6.

FIG. 5 shows a cross-sectional view of MCM 502 mounted on PCB 590 by solder bodies 592 at surface 571 of MCM 502. MCM 502 includes control active die 521 providing top-drain vertical FET 520 having drain 522, source 524, and gate 526, and implementing control switch $Q_1$. In addition, MCM 502 includes sync active die 531 providing bottom-drain vertical FET 530 having drain 532, source 534, and gate 536, and implementing sync switch $Q_2$. MCM 502 also includes driver IC 594 for driving one or both of top-drain vertical FET 520 and bottom-drain vertical FET 530.

MCM 502 further includes conductive carriers 510a and 510b having respective surfaces 518a and 518b, electrically conductive die attach material 519, patterned dielectric 540, insulator 582 partially filling isolation trench 580 and forming an insulation layer at surface 585, and patterned insulator layer 572 providing surface 571. It is noted that the portion of isolation trench 580 not filled by insulator 582 is filled by patterned dielectric 540. Also included in MCM 502 are drain contact 562, source contact, 554, gate contacts 566 and 556, switch node contact 550, input/output (I/O) pads 596a and 596b of driver IC 594, and die attach material 593 for attaching driver IC 594 to conductive carrier 510b.

According to the present implementation, isolation trench 580 provides electrical isolation between conductive carrier 510b supporting drive IC 594, and conductive carrier 510a supporting top-drain vertical FET 520 and bottom-drain vertical FET 530 and providing switch node contact 550. Moreover isolation trench 580 isolates driver IC 594 from switching noise that may be produced by the power converter switching stage implemented by top-drain vertical FET 520 and bottom-drain vertical FET 530. As a result, die attach material 593 may be an electrically conductive die attach material or a dielectric die attach material.

Conductive carrier 510a, respective top-drain and bottom-drain vertical FETs 520 and 530, and electrically conductive die attach material 519 correspond respectively to conductive carrier 210, respective top-drain and bottom-drain vertical FETs 220 and 230, and electrically conductive die attach material 219, in FIG. 2. In addition, patterned dielectric 540, insulator 582, contacts 562, 566, 550, 554, and 556, and patterned insulator layer 572, in FIG. 5, correspond respectively to patterned dielectric 240, insulator 282, contacts 262, 266, 250, 254, and 256, and patterned insulator layer 272, in FIG. 2. Moreover, it is noted that MCM 502 including driver IC 594, in FIG. 5, corresponds in general to MCM 102 including driver IC 194, in FIG. 1.

According to the implementation shown in FIG. 5, conductive carrier 510a advantageously provides switch node contact 550 and thereby couples source 524 of top-drain vertical FET 520 to drain 532 of bottom-drain vertical FET 530. It is noted that although not shown in FIG. 5, in some implementations, MCM 502 may include a heat spreader. For example, a heat spreader corresponding to heat spreader 286 in FIG. 2 may be attached to conductive carrier 510b and/or conductive carrier 510a through insulator 582 providing surface 585.

Referring now to FIG. 6, FIG. 6 shows a cross-sectional view of an exemplary semiconductor package including a top-drain configured power FET and a driver IC, according to another implementation. FIG. 6 shows MCM 602 mounted on PCB 690 by solder bodies 692 at surface 671 of MCM 602. MCM 602 includes control active die 621 providing top-drain vertical FET 620 having drain 622, source 624, and gate 626, and implementing control switch $Q_1$. In addition, MCM 602 includes sync active die 631 providing bottom-drain vertical FET 630 having drain 632, source 634, and gate 636, and implementing sync switch $Q_2$. MCM 602 also includes driver IC 694 for driving one or both of top-drain vertical FET 620 and bottom-drain vertical FET 630.

MCM 602 further includes conductive carrier 610 having surface 618, electrically conductive die attach material 619, patterned dielectric 640, and patterned insulator layer 672 providing surface 671. Also included in MCM 602 are drain contact 662, source contact 654, gate contacts 666 and 656, switch node contact 650, input/output (I/O) pads 696a and 696b of driver IC 694, and die attach material 693 for attaching driver IC 694 to conductive carrier 610.

Conductive carrier 610, respective top-drain and bottom-drain vertical FETs 620 and 630, and electrically conductive die attach material 619 correspond respectively to conductive carrier 210, respective top-drain and bottom-drain vertical FETs 220 and 230, and electrically conductive die attach material 219, in FIG. 2. In addition, patterned dielectric 640, contacts 662, 666, 650, 654, and 656, and patterned insulator layer 672, in FIG. 6, correspond respectively to patterned dielectric 240, contacts 262, 266, 250, 254, and 256, and patterned insulator layer 272, in FIG. 2. Moreover, it is noted that MCM 602 including driver IC 694, in FIG. 6, corresponds in general to MCM 102 including driver IC 194, in FIG. 1.

According to the present implementation, the absence of I/O pads on side 695 of driver IC 694, as well as the insulating properties of any encapsulant or packaging of driver IC 694 may be sufficient to isolate driver IC 694 from conductive carrier 610, to which driver IC 694 is attached. As a result, in some implementations, die attach material 693 may be an electrically conductive die attach material. However, in some implementations, die attach material 693 may be a dielectric die attach material, thereby providing additional electrical isolation between conductive carrier 610 and driver IC 694.

As shown in FIG. 6, conductive carrier 610 advantageously provides switch node contact 650 and thereby couples source 624 of top-drain vertical FET 620 to drain 632 of bottom-drain vertical FET 630. It is noted that although not shown in FIG. 6, in some implementations, MCM 602 may include a heat spreader. For example, a heat spreader corresponding to heat spreader 286 in FIG. 2 may be attached to conductive carrier 610 at surface 618.

Thus, by utilizing a power converter package including a top-drain configured power FET, the packaging solutions disclosed herein enable omission of a conductive clip, or any other feature implemented solely or primarily as a switch node electrical connector, from an MCM package. As a result, implementations of the present solution advantageously provide a reliable, low resistance, and substantially parasitic free electrical connection for establishing a power converter switch node in a power converter package having a highly compact design.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
a top-drain vertical FET in a first active die, a source of said top-drain vertical FET situated on a source side of said first active die and a drain and a gate of said top-drain vertical FET situated on a drain side of said first active die;
a bottom-drain vertical FET in a second active die, a source and a gate of said bottom-drain vertical FET situated on a source side of said second active die and a drain of said bottom-drain vertical FET situated on a drain side of said second active die;
a conductive carrier attached to said source side of said first active die and to said drain side of said second active die;
said conductive carrier coupling said source of said top-drain vertical FET to said drain of said bottom-drain vertical FET; and
a patterned dielectric formed over said drain side of said first active die and said source side of said second active die, said patterned dielectric exposing said drain and said gate of said top-drain vertical FET and said source and said gate of said bottom-drain vertical FET.

2. The semiconductor package of claim 1, wherein said conductive carrier comprises a lead frame.

3. The semiconductor package of claim 1, wherein said top-drain vertical FET and said bottom-drain vertical FET comprise silicon FETs.

4. The semiconductor package of claim 1, wherein said top-drain vertical FET and said bottom-drain vertical FET comprise III-Nitride FETs.

5. The semiconductor package of claim 1, further comprising a driver integrated circuit (IC) for driving at least one of said top-drain vertical FET and said bottom-drain vertical FET.

6. The semiconductor package of claim 1, further comprising a driver IC for driving at least one of said top-drain vertical FET and said bottom-drain vertical FET, said conductive carrier being attached to said driver IC.

7. The semiconductor package of claim 1, wherein said top-drain vertical FET and said bottom-drain vertical FET are utilized to implement a switching stage of a buck converter.

8. A semiconductor package comprising:
a power converter switching stage including a control vertical PET in a control active die and a sync vertical FET in a sync active die;
said control vertical FET having a source situated on a source side of said control active die and a drain and a gate situated on a drain side of said control active die;
said sync vertical FET having a source and a gate situated on a source side of said sync active die and a drain situated on a drain side of said sync active die;
a conductive carrier being attached to said source side of said control active die and to said drain side of said sync active die;
said conductive carrier providing a switch node of said power converter switching stage; and
a patterned dielectric formed over said drain side of said control active die and said source side of said sync active die, said patterned dielectric exposing said drain and said gate of said control vertical FET and said source and said gate of said sync vertical FET.

9. The semiconductor package of claim 8, wherein said conductive carrier comprises a lead frame.

10. The semiconductor package of claim 8, wherein said control vertical FET and said sync vertical FET comprise silicon FETs.

11. The semiconductor package of claim 8, wherein said control vertical FET and said sync vertical FET comprise III-Nitride FETs.

12. The semiconductor package of claim 8, further comprising a driver integrated circuit (IC) for driving at least one of said control vertical FET and said sync vertical FET.

13. The semiconductor package of claim 8, further comprising a driver IC for driving at least one of said control vertical FET and said sync vertical FET, said conductive carrier being attached to said driver IC.

14. The semiconductor package of claim 1, wherein said power converter switching stage is implemented as part of a buck converter.

15. A method for fabricating a semiconductor package, said method comprising:
providing a top-drain vertical FET in a first active die, a source of said top-drain vertical FET situated on a source side of said first active die and a drain and a gate of said top-drain vertical FET situated on a drain side of said first active die;
providing a bottom-drain vertical FET in a second active die, a source and a gate of said bottom-drain vertical FET situated on a source side of said second active die and a drain of said bottom-drain vertical FET situated on a drain side of said second active die;
attaching a conductive carrier to said source side of said first active die and to said drain side of said second active die;
utilizing said conductive carrier to couple said source of said top-drain vertical FET to said drain of said bottom-drain vertical FET; and
forming a patterned dielectric over said drain side of said first active die and said source side of said second active die, said patterned dielectric exposing said drain and said gate of said top-drain vertical FET and said source and said gate of said bottom-drain vertical FET.

16. The method claim 15, wherein said conductive carrier comprises a lead frame.

17. The method claim 15 wherein said top-drain vertical FET and said bottom-drain vertical FET comprise silicon FETs.

18. The method claim 15, wherein said top-drain vertical FET and said bottom-drain vertical FET comprise III-Nitride FETs.

19. The method claim 15, further comprising attaching said conductive carrier to a driver integrated circuit (IC) for driving at least one of said top-drain vertical FET and said bottom-drain vertical FET.

20. The method claim 15, wherein said top-drain vertical FET and said bottom-drain vertical FET are utilized to implement a switching stage of a buck converter.

* * * * *